(12) United States Patent
Asano

(10) Patent No.: US 8,758,536 B2
(45) Date of Patent: *Jun. 24, 2014

(54) METHOD FOR MANUFACTURING CERAMIC PLATES

(71) Applicant: Murata Manufacturing Co., Ltd., Nagaokakyo (JP)

(72) Inventor: Hiroshi Asano, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/653,453

(22) Filed: Oct. 17, 2012

(65) Prior Publication Data

US 2013/0277415 A1    Oct. 24, 2013

Related U.S. Application Data

(63) Continuation of application No. 11/955,809, filed on Dec. 13, 2007, which is a continuation of application No. PCT/JP2005/015141, filed on Aug. 19, 2005.

(30) Foreign Application Priority Data

Jun. 14, 2005   (JP) .................................. 2005-173545

(51) Int. Cl.
*C03B 29/00* (2006.01)
*B29C 63/00* (2006.01)

(52) U.S. Cl.
USPC .......................... 156/89.11; 156/702; 156/703

(58) Field of Classification Search
USPC ............. 156/705, 754, 89.11, 89.12, 47, 702, 156/703; 264/607, 608; 603/614, 615, 681; 429/33
See application file for complete search history.

(56) References Cited

U.S. PATENT DOCUMENTS

| 2001/0035253 A1* | 11/2001 | Kawakita et al. ........... 156/89.12 |
| 2001/0036896 A1* | 11/2001 | Wada et al. ................... 501/139 |
| 2002/0171997 A1* | 11/2002 | Togashi et al. ............. 361/308.1 |

FOREIGN PATENT DOCUMENTS

| JP | 2005015254 A | * | 1/2005 |
| JP | 2005015255 A | * | 1/2005 |

OTHER PUBLICATIONS

Kachi et al., JP 2005-015255 A Machine Translation, Published Jan. 2005.*
Kachi et al., JP 2005-015254 A Machine Translation, Published Jan. 2005.*
Asano; "Method for Manufacturing Ceramic Plates"; U.S. Appl. No. 11/955,809, filed Dec. 13, 2007.

* cited by examiner

*Primary Examiner* — Philip Tucker
*Assistant Examiner* — Alex Efta
(74) *Attorney, Agent, or Firm* — Keating & Bennett, LLP

(57) ABSTRACT

In a method for manufacturing ceramic plates, a Pd paste which does not diffuse into ceramic is formed; metal films each having a thickness such that ceramic layers to be formed after firing are not connected to each other in the lamination direction are formed on surfaces of ceramic green sheets using the Pd paste; then, a firing treatment at a firing temperature, which is a high temperature at which no glass component remains on surfaces of the ceramic layers after the firing and which is equal to or lower than a decomposition temperature of a ceramic material forming the ceramic layers, is performed for a laminate; oxygen present at the interfaces between the ceramic layers and the metal layers is removed by immersing a sintered body in n-butyl alcohol so as to separate the ceramic layers and the metal layers.

10 Claims, 6 Drawing Sheets

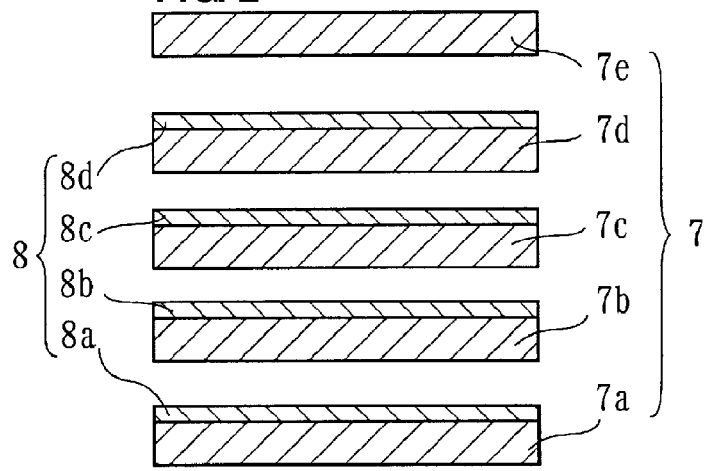
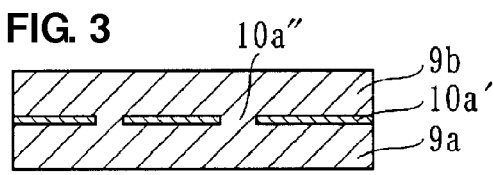
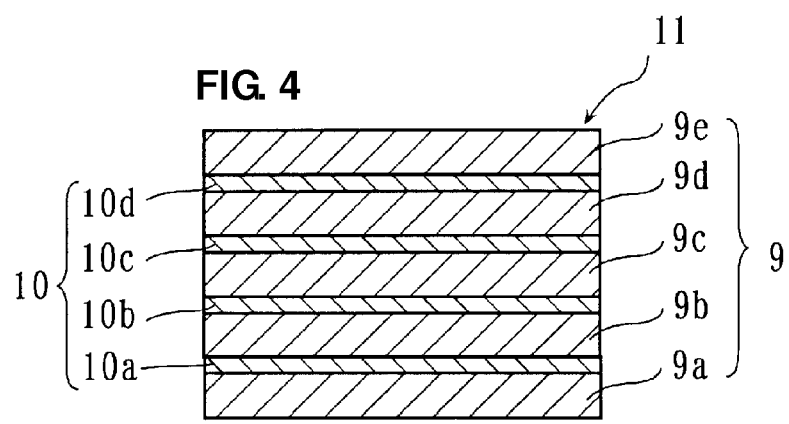

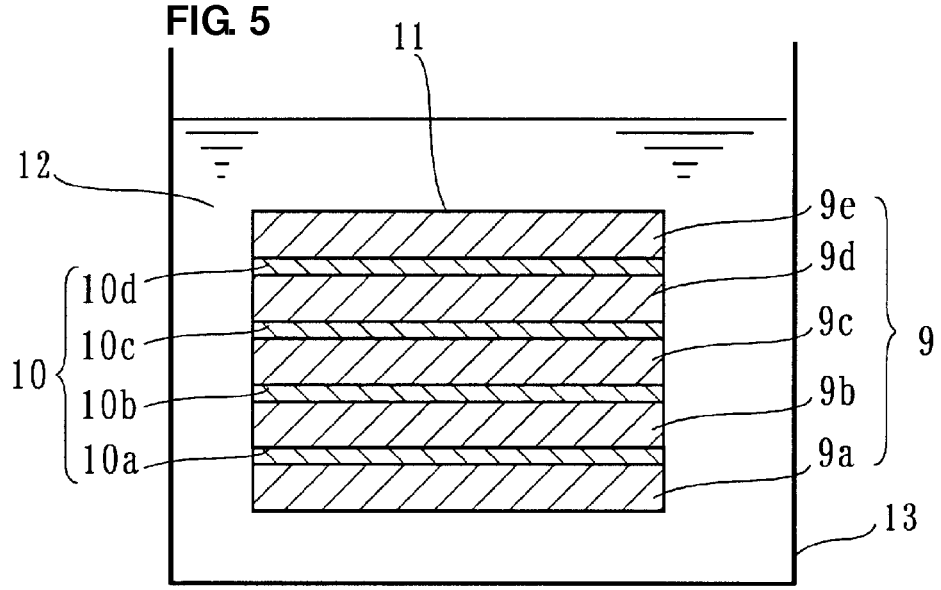
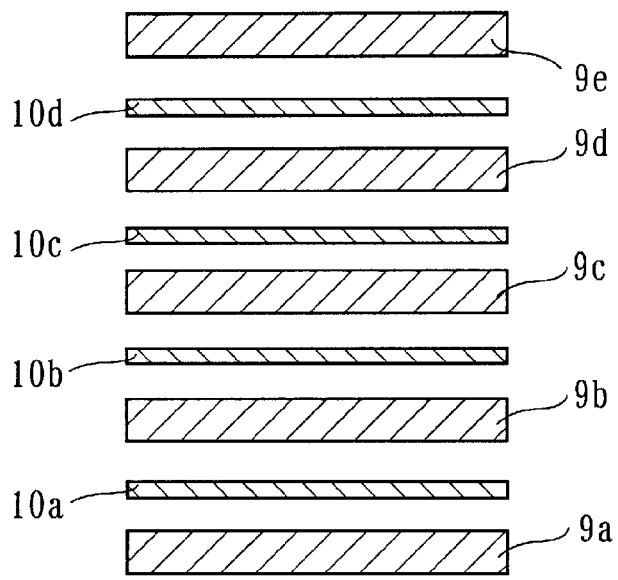

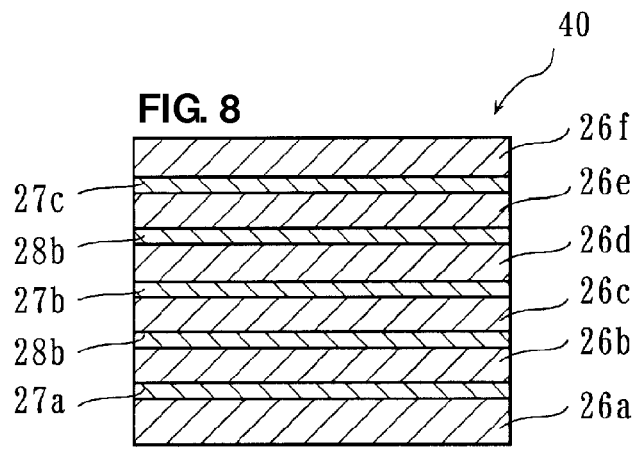
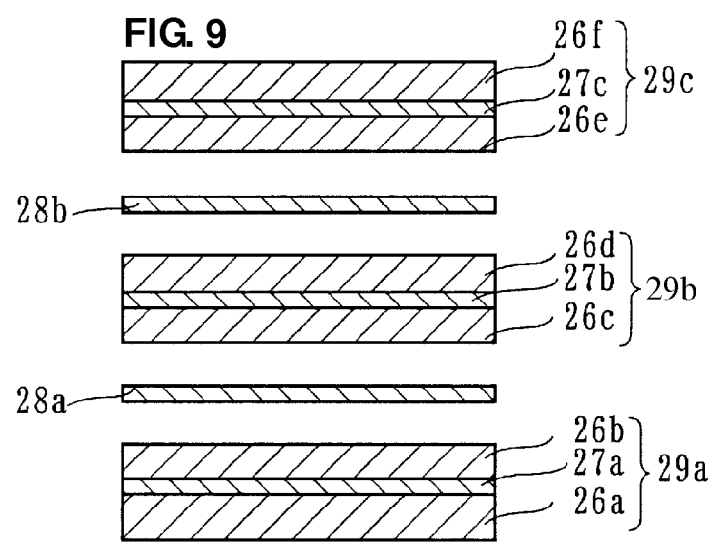
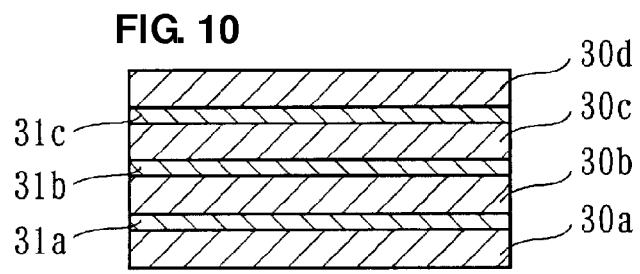

METHOD FOR MANUFACTURING CERAMIC PLATES

This is a continuation of application Ser. No. 11/955,809, filed Dec. 13, 2007.

BACKGROUND OF THE INVENTION

1. Field of the Invention

The present invention relates to methods for manufacturing ceramic plates, and more particularly, relates to a method for manufacturing ceramic plates in which ceramic layers are separated from a sintered body including ceramic layers and metal layers alternately laminated to each other, to obtain the ceramic plates.

2. Description of the Related Art

In recent years, in various ceramic electronic components, such as an IC substrate and a ceramic capacitor, a decrease in thickness and a reduction in size have been advanced. It has also been requested to further decrease the thickness of a ceramic plate used for forming ceramic electronic components.

In addition, as a method for manufacturing the ceramic plate as described above, a method for forming thin ceramic plates has been proposed in which, after a laminate is formed by laminating ceramic green sheets provided with un-sintered metal films, the laminate is processed by a firing treatment to form a sintered body 103 composed of ceramic layers 101 and metal layers 102 alternately laminated to each other, and as shown in FIG. 13, while the sintered body 103 is immersed in an alcohol 104, an external force, such as ultrasonic waves, is applied to the sintered body 103 as shown by arrows to separate the metal layers 102 and the ceramic layers 101.

However, according to Japanese Unexamined Patent Application Publication No. 2005-15254, since the ceramic layers 101 and the metal layers 102 are separated by application of an external force, such as ultrasonic waves, to the sintered body 103, when the ceramic layers 101 have an extremely small thickness (such as 10 µm or less), a problem may arise in some cases in that the ceramic layers 101 are damaged, for example, by cracks generated therein caused by the external force applied thereto.

In addition, according to Japanese Unexamined Patent Application Publication No. 2005-15254, since the external force is applied to the sintered body as described above, the ceramic layers 101 and the metal layers 102 are separated into individual layers, and as a result, a ceramic plate having a laminate structure cannot be obtained. Hence, it has been difficult to apply a separated ceramic plate to laminate type electronic components.

In addition, according to a technique of Japanese Unexamined Patent Application Publication No. 2005-15255, although the separation between the ceramic layer 101 and the metal layer 102 can be easily performed by the use of platinum or iridium as a metal film component, since the ceramic layer 101 and the metal layer 102 are separated from each other by applying an external force, such as ultrasonic waves, to the sintered body 103 as in the case of Japanese Unexamined Patent Application Publication No. 2005-15254, the ceramic layer 101 may also be damaged when the thickness thereof is extremely small, and hence it is also difficult to apply the above technique to laminate type electronic components.

SUMMARY OF THE INVENTION

In order to overcome the problems described above, preferred embodiments of the present invention provide a method for manufacturing ceramic plates, which can efficiently manufacture extremely thin ceramic plates without causing any damage thereto, and which can be easily applied to laminate type electronic components.

In a sintered body composed of ceramic layers and metal layers alternately laminated to each other, it has been believed that the ceramic layer and the metal layer are connected to each other in combination among the following four factors:

(1) the presence of oxygen at the interface between the ceramic layer and the metal layer, (2) the presence of crosslinking connecting the ceramic layers through the metal layer, (3) the diffusion of a metal component to the ceramic layer in firing, and (4) the presence of a glass component on a surface of the ceramic layer.

Hence, when the above connection factors (1) to (4) are all removed, without applying any external force to the sintered body, the ceramic layer and the metal layer can be easily separated from each other.

Accordingly, through intensive research carried out by the inventors of the present invention in order to remove all the connection factors (1) to (4) described above, it was discovered that as for the factor (1), oxygen present between the ceramic layer and the metal layer can be removed when the sintered body is immersed in an oxygen removal processing liquid so as to cause an oxidation-reduction reaction at the interface; the factor (2) can be resolved when an unsintered metal film is formed to have a large thickness such that crosslinking does not occur between the ceramic layers; the factor (3) can be resolved when a metal material which does not diffuse into the ceramic layer side during a firing treatment is used; and as for the factor (4), when the firing temperature is set to a high temperature at which no glass component remains on a surface of the ceramic layer after firing and to a temperature equal to or lower than a decomposition temperature of a ceramic material forming the ceramic layer, even after the laminate is processed by the firing treatment, the glass component can be prevented from remaining on the surface of the ceramic layer without decomposition of the ceramic material.

Based on the discoveries and findings as described above, preferred embodiments of the present invention were developed, and a method for manufacturing ceramic plates according to a preferred embodiment of the present invention is a method for manufacturing ceramic plates by separating ceramic layers from a sintered body composed of the ceramic layers and metal layers alternately laminated to each other, and the method includes: a ceramic green-sheet forming step of forming ceramic green sheets from ceramic raw materials; a metal paste forming step of forming a metal paste using a metal component as a solid component which does not diffuse into the ceramic during firing; a metal film forming step of applying the metal paste on surfaces of the ceramic green sheets to form metal films each having a thickness such that ceramic layers to be formed after firing are not connected to each other in the lamination direction; a laminate forming step of laminating the ceramic green sheets provided with the metal films to form a laminate; a firing step of performing a firing treatment for the laminate at a firing temperature which is set to a high temperature at which no glass component remains on surfaces of the ceramic layers after the firing and to a temperature equal to or lower than a decomposition temperature of a ceramic material forming the ceramic layers so as to form the sintered body composed of the ceramic layers and the metal layers alternately laminated to each other; and a separation step of immersing the sintered body in an oxygen removal processing liquid which removes oxygen present between the ceramic layers and the metal layers to separate the ceramic layers and the metal layers.

In addition, when an electrode paste containing a conductive component which diffuses into the ceramic during the firing is applied to surfaces of the ceramic green sheets to form electrode films, and the ceramic green sheets provided with the electrode films and the ceramic green sheets provided with the metal films are appropriately laminated to each other, ceramic plates having a laminate structure can be obtained.

That is, the method for manufacturing ceramic plates, according to a preferred embodiment of the present invention, may further include: an electrode paste forming step of forming an electrode paste containing a conductive component which diffuses into the ceramic green sheets during the firing; and an electrode film forming step of applying the electrode paste on surfaces of the ceramic green sheets to form electrode films, and in addition, the laminate formed in the laminate forming step includes the ceramic green sheets provided with the electrode films.

In addition, as the metal component which does not diffuse into the ceramic during the firing, palladium may be used.

That is, in the method for manufacturing ceramic plates, according to a preferred embodiment of the present invention, the metal component of the metal paste may include palladium.

Furthermore, as the oxygen removal processing liquid, a reducing solution including an organic compound which includes at least one of a hydroxyl group (—OH), an aldehyde group (—CHO), and a carboxyl group (—COOH) may be used; in particular, a liquid alcohol is preferably used which is one of an aliphatic alcohol, a cycloaliphatic alcohol, an aromatic alcohol, a heterocyclic alcohol, and a mixture thereof; and as the liquid alcohol, in particular, as the aliphatic alcohol, n-butyl alcohol is more preferably used.

That is, in the method for manufacturing ceramic plates, according to a preferred embodiment of the present invention, the oxygen removal processing liquid may be a reducing solution which includes an organic compound containing at least one of a hydroxyl group, an aldehyde group, and a carboxyl group.

In addition, the oxygen removal processing liquid may comprise a liquid alcohol, and further, the liquid alcohol may be one of an aliphatic alcohol, a cycloaliphatic alcohol, an aromatic alcohol, a heterocyclic alcohol, and a mixture thereof.

Furthermore, the aliphatic alcohol is preferably n-butyl alcohol.

In addition, preferred embodiments of the present invention are suitable for use to obtain ceramic plates of a lead-based piezoelectric ceramic material.

That is, in the method for manufacturing ceramic plates, according to various preferred embodiments of the present invention, the ceramic material forming the ceramic green sheets is preferably a lead-based piezoelectric ceramic material containing a lead component.

In addition, although it is believed that the thickness of the metal film which prevents the ceramic layers to be formed by the firing from being connected to each other in the lamination direction varies depending on ceramic materials to be used, it was discovered that from the results of the research carried out by the inventors of the present invention, in the case in which a piezoelectric ceramic material is used, when the thickness of the metal film is set in the range of about 1.9 µm to about 10 µm, for example, the ceramic layers can be formed so as not to be connected to each other.

That is, in the method for manufacturing ceramic plates, according to a preferred embodiment of the present invention, the thickness of the metal film is preferably in the range of about 1.9 µm to about 10 µm, for example.

In addition, in the method for manufacturing ceramic plates, according to a preferred embodiment of the present invention, the ceramic green-sheet forming step may form a plurality types of ceramic green sheets which have different thicknesses.

The method for manufacturing ceramic plates, according to a preferred embodiment of the present invention, includes: a ceramic green-sheet forming step of forming ceramic green sheets from ceramic raw materials; a metal paste forming step of forming a metal paste using a metal component (such as palladium) as a solid component which does not diffuse into ceramic during firing; a metal film forming step of applying the metal paste on surfaces of the ceramic green sheets to form metal films each having a thickness (such as about 1.9 µm to about 10 µm) so that ceramic layers to be formed after firing are not connected to each other; a laminate forming step of laminating the ceramic green sheets provided with the metal films to form a laminate; a firing step of performing a firing treatment for the laminate at a firing temperature which is set to a high temperature at which no glass component remains on surfaces of the ceramic layers to be formed after the firing and to a temperature equal to or lower than a decomposition temperature of a ceramic material, such as a lead-based piezoelectric ceramic material, forming the ceramic layers so as to form the sintered body composed of the ceramic layers and the metal layers alternately laminated to each other; and a separation step of immersing the sintered body in an oxygen removal processing liquid, such as a liquid alcohol (n-butyl alcohol or the like), which removes oxygen present between the ceramic layers and the metal layers to separate the ceramic layers and the metal layers; hence, the ceramic layers and the metal layers can be easily separated from each other without applying any external force to the sintered body, and as a result, ceramic plates even having a very small thickness can be efficiently manufactured without causing any damage thereto.

In addition, since the method for manufacturing ceramic plates, according to a preferred embodiment of the present invention, may further include an electrode paste forming step of forming an electrode paste containing a conductive component which diffuses into the ceramic during the firing and an electrode film forming step of applying the electrode paste on surfaces of the ceramic green sheets to form electrode films, and the laminate formed in the laminate forming step may include the ceramic green sheets provided with the electrode films, when the ceramic green sheets provided with the electrode films and the ceramic green sheets provided with the metal films are appropriately laminated to each other, ceramic layers each having a laminate structure composed of the ceramic layers and the electrode layers, which are alternately laminated to each other, can be separated from the metal layers. Accordingly, the ceramic layers each having the laminate structure described above can be used as ceramic plates and can be easily applied to laminate type electronic components.

In addition, since the ceramic green-sheet forming step may form a plurality types of ceramic green sheets which have different thicknesses, ceramic layers having different thicknesses can be separated from the metal layers, and hence ceramic plates having different thicknesses can be simultaneously and easily manufactured.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 2 is a cross-sectional view showing the state in which metal films are formed on ceramic green sheets in a metal film forming step.

FIG. 3 is a view illustrating a problem in the case in which a metal film has a small thickness.

FIG. 4 is a cross-sectional view of a sintered body obtained in a sintering step.

FIG. 5 is a view showing the state in which a sintered body is immersed in an oxygen removal processing liquid in a separation step.

FIG. 6 is a cross-sectional view showing the state in which ceramic layers and metal layers are separated from each other.

FIG. 8 is a cross-sectional view of a sintered body obtained in a sintering step of another preferred embodiment of the present invention.

FIG. 9 is a cross-sectional view showing the state in which ceramic layers each having a laminate structure and metal layers are separated from each other.

FIG. 10 is a cross-sectional view of a first laminate formed in Example 6.

DETAILED DESCRIPTION OF PREFERRED EMBODIMENTS

Next, preferred embodiments according to the present invention will be described in detail with reference to the drawings.

Figure 1:
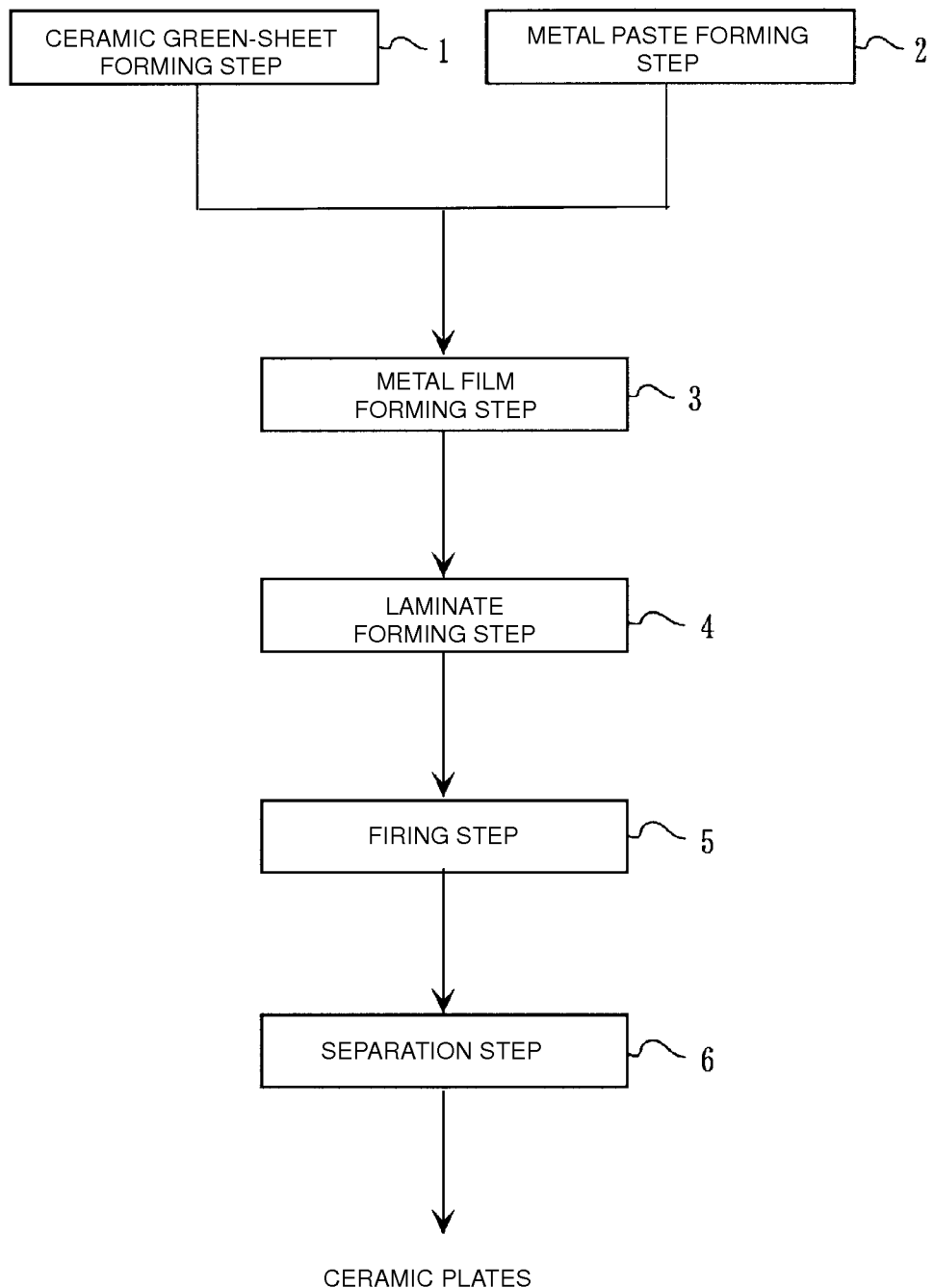
FIG. 1 is a flowchart of a method for manufacturing ceramic plates of a preferred embodiment according to the present invention.

FIG. 1 is a flowchart showing a method for manufacturing ceramic plates of a preferred embodiment according to the present invention, and hereinafter, the case in which ceramic plates containing a Pb component are manufactured will be described.

First, in a ceramic green-sheet forming step 1, ceramic green sheets are formed from ceramic raw materials.

That is, after ceramic raw materials, such as $Pb_3O_4$, $TiO_2$, and $ZrO_2$, in predetermined amounts are weighed and charged in a ball mill containing pulverizing media, followed by mixing and wet pulverization, drying is performed, and a calcination treatment is then performed at a predetermined temperature, so that a powdered piezoelectric ceramic is formed.

Subsequently, an organic binder and a dispersing agent are added to the powdered piezoelectric ceramic together with purified water and are then again mixed and wet-pulverized in a ball mill to form a ceramic slurry, and subsequently, the ceramic slurry is processed by a forming method such as a doctor blade method, thereby forming ceramic green sheets each having a predetermined thickness.

In addition, in a metal paste forming step 2, a metal paste to be applied to surfaces of the ceramic green sheets is formed.

That is, a metal component, such as powdered Pd (palladium), which does not diffuse into ceramic during firing is mixed with an organic vehicle and is then compounded therewith using a three-roller mill to form the metal paste.

In this preferred embodiment, as the organic vehicle, a compound may be used which is formed of an organic solvent, such as terpineol, and an organic binder, such as an ethyl cellulose resin, dissolved therein. In addition, the ratio between the Pd powder and the organic vehicle is not particularly limited; however, for example, a compound containing powdered Pd and an organic vehicle at a ratio of about 55% to about 45% on a weight percent basis may be used.

Next, in a metal film forming step 3, as shown in FIG. 2, the metal paste is applied to the entire surfaces of ceramic green sheets 7a to 7d to form metal films 8a to 8d.

That is, although the ceramic green sheets 7a to 7d provided with the metal films 8a to 8d, respectively, are laminated to each other and are then fired as described below, when the thicknesses of the metal films 8a to 8d are small, for example as shown in FIG. 3, holes are formed in a metal layer 10a' which is a sintered body of the metal film 8a, and the holes are filled with a ceramic material. As a result, through the metal layer 10a', ceramic layers 9a and 9b, which are sintered bodies of the ceramic green sheets 7a and 7b, respectively, are connected to each other through the metal layer 10a', and crosslinking 10a" is formed. Accordingly, since the ceramic layers are tightly connected to each other by the crosslinking 10a" interposed therebetween, it becomes difficult to separate the ceramic layers 9a and 9b from the metal layer 10a'.

Accordingly, in this preferred embodiment, the thicknesses of the metal films 8a to 8d are adjusted so that the ceramic layers to be formed after the firing are not connected to each other. The desired thickness of the metal film 8 as described above varies depending on ceramic materials. However, in the case in which a Pb-based piezoelectric ceramic is used as this preferred embodiment, the thickness is preferably in the range of about 1.9 μm to about 10 μm and is more preferably in the range of about 3 μm to about 5 μm, for example.

In the following laminate forming step 4, after the ceramic green sheets 7a to 7d provided with the metal films 8a to 8d, respectively, are laminated to each other, and a ceramic green sheet 7e is laminated on the topmost layer, the ceramic green sheet 7 (7a to 7e) and the metal film 8 (8a to 8d) are pressure-bonded in the lamination direction to form a laminate.

Subsequently, in a firing step 5, a firing treatment is performed for the laminate described above, and as shown in FIG. 4, a sintered body 11 composed of ceramic layers 9 (9a to 9e) and metal layers 10 (10a to 10d) alternately laminated to each other is formed.

In this preferred embodiment, the firing temperature is set to a high temperature at which no glass component remains on surfaces of the ceramic layers 9 and is also set to a temperature equal to or lower than a decomposition temperature of a ceramic material forming the ceramic layers 9.

That is, in the case of a Pb-based piezoelectric ceramic material, since liquid phase PbO is generally generated when a firing treatment is performed, a liquid phase sintering is also performed. In addition, since the liquid phase PbO also permeates the interfaces between the metal films 8 and the respective ceramic green sheets 7 during the firing treatment, when the sintering is completed in the state described above, low melting point glass layers are formed at the interfaces between the metal layers 10 which are sintered bodies of the metal films 8 and the respective ceramic layers 9 which are sintered bodies of the ceramic green sheets 7. That is, the glass component remains on the surfaces of the ceramic layers 9. In this case, since the glass component described above functions as an adhesive to the metal layers 10, a separation treatment, which will be described later, between the ceramic layers 9 and the respective metal layers 10 will be disturbed.

Accordingly, in this preferred embodiment, the firing temperature is set to a high temperature so that no glass component remains, and in this embodiment, the firing temperature is preferably set to about 1,100° C. or more.

However, when the firing temperature is increased at which the ceramic material is decomposed, desired ceramic plates cannot be obtained, and hence the upper limit of the firing temperature must be set to the decomposition temperature of the ceramic material or less.

Next, in a separation step 6, as shown in FIG. 5, the sintered body 11 is immersed in a treatment bath 13 filled with an oxygen removal processing liquid 12, and as shown in FIG. 6, the ceramic layers 9 and the metal layers 10 are separated from each other, so that the ceramic plates are obtained.

That is, since the ceramic layers 9 are prevented from being connected to each other to form crosslinking by the control of the thickness of the metal films 8; the metal component is prevented from diffusing to the ceramic green sheet side by the use of Pd as the metal component; and the glass component is prevented from remaining on the surfaces of the ceramic layers by the adjustment of the firing temperature, when the separation step 6 is actually performed, the connection factor between the ceramic layers 9 and the respective metal layers 10 is only oxygen present at the interfaces therebetween.

Accordingly, in this preferred embodiment, the sintered body 11 is immersed in the oxygen removal processing liquid 12 for a predetermined time, so that the oxygen present at the interfaces is removed.

As the oxygen removal processing liquid 12, a reducing solution of an organic compound including at least one of a hydroxyl group, an aldehyde group, and a carboxyl group may be used, and when the sintered body 11 is immersed in this type of reducing solution, an oxidation-reduction reaction occurs at the interface, so that the oxygen present at the interfaces can be removed.

As the oxygen removal processing liquid 12 described above, in particular, a liquid alcohol is preferably used. As the liquid alcohol, one of an aliphatic alcohol, a cycloaliphatic alcohol, an aromatic alcohol, a heterocyclic alcohol, and a mixture thereof may be used. In particular, a lower aliphatic monovalent alcohol in which the number of carbon atoms Cn is 1 to 6, such as ethyl alcohol, n-propyl alcohol, isopropyl alcohol, or n-butyl alcohol, which is an aliphatic alcohol, is preferably used, and more particularly, n-butyl alcohol is preferably used.

Since the method for manufacturing ceramic plates described above includes: the ceramic green-sheet forming step 1 of forming the ceramic green sheets 7 from the ceramic raw materials; the metal paste forming step 2 of forming the metal paste using Pd as a solid component which does not diffuse into ceramic green sheet 7 sides during firing; the metal film forming step 3 of applying the metal paste on the surfaces of the ceramic green sheets to form the metal films 8 each having a thickness such that the ceramic layers to be formed after firing are not connected to each other; the laminate forming step 4 of laminating the ceramic green sheets 7 provided with the metal films 8 to form a laminate; the firing step 5 of performing a firing treatment for the laminate at a firing temperature which is set to a high temperature at which no glass component remains on the surfaces of the ceramic layers 9 to be formed after the firing and to a temperature equal to or lower than the decomposition temperature of the Pb-based piezoelectric ceramic material so as to form the sintered body 11 composed of the ceramic layers 9 and the metal layers 10 alternately laminated to each other; and the separation step 6 of immersing the sintered body 11 in the oxygen removal processing liquid 12 which removes oxygen present between the ceramic layers 9 and the respective metal layers 10 to separate the ceramic layers 9 and the metal layers 10, the following four connection factors between the ceramic layers 9 and the respective metal layers 10 can all be removed, which are:

(1) the presence of oxygen between the ceramic layer and the metal layer, (2) the presence of the ceramic layers penetrating the metal film, (3) the diffusion of the metal component to the ceramic layer in firing, and (4) the presence of the glass component on the surface of the ceramic layer.

Hence, without applying an external force, such as ultrasonic waves, the ceramic layers 9 and the metal layers 10 can be easily separated from each other, and as a result, good quality ceramic plates having no damage, such as cracks, can be obtained with high efficiency.

Figure 7:
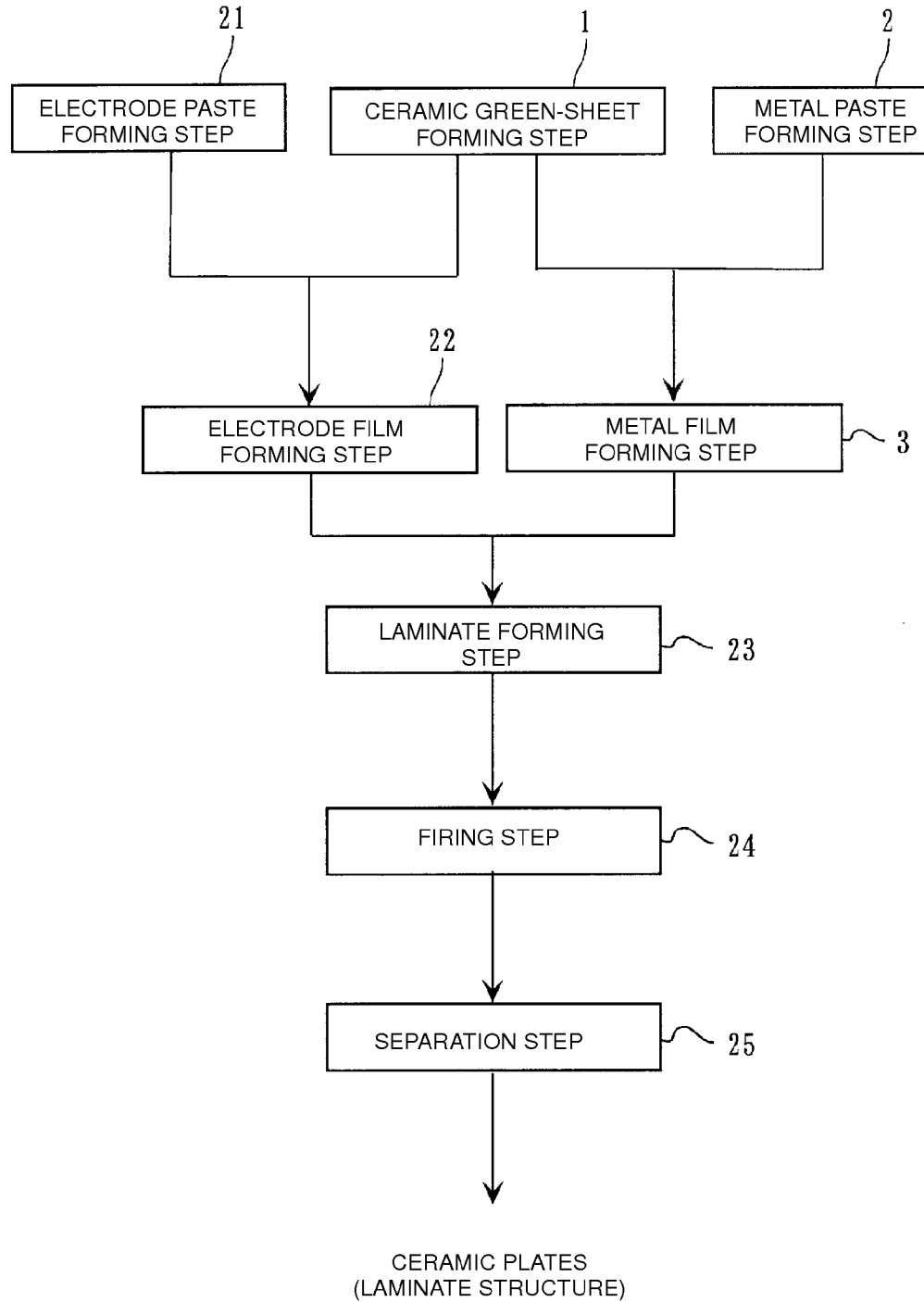
FIG. 7 is a flowchart of a method for manufacturing ceramic plates of another preferred embodiment according to the present invention.

FIG. 7 is a flowchart showing a method for manufacturing ceramic plates of another preferred embodiment according to the present invention, and in this additional preferred embodiment, electrode films which diffuse into ceramic during firing are provided between ceramic green sheets, so that ceramic plates each having a laminate structure are obtained.

That is, an electrode paste containing a conductive component, such as Ag—Pd or Ag, as a primary component, which is diffusible also to the ceramic when a laminate is co-sintered, is formed in an electrode paste forming step 21, and in an electrode film forming step 22, by using this electrode paste, screen printing is performed on surfaces of the ceramic green sheets formed in the ceramic green-sheet forming step 1, so that electrode films each having a predetermined pattern are formed. In this case, it is not necessary to increase the thickness of the electrode film to that of the metal film.

In addition, in a laminate forming step 23, after the ceramic green sheets provided with the electrode films and the ceramic green sheets provided with the metal films are alternately laminated to each other, a ceramic green sheet is laminated on the topmost layer, followed by pressure bonding, so that the laminate is formed. In a firing step 24, at a firing temperature which is set under temperature conditions similar to those of the above-described preferred embodiment, the laminate is processed by a firing treatment, so that a sintered body 40 containing a ceramic layer 26a, an electrode layer 27a, a ceramic layer 26b, a metal layer 28a, . . . and a ceramic layer 26f laminated in that order as shown in FIG. 8 is obtained.

Subsequently, in a separation step 25, the sintered body 40 is immersed in the oxygen removal processing liquid used in the above-described preferred embodiment for a predetermined time. Since a portion of the conductive component forming the electrode layers 27 (27a to 27c) diffuses to the ceramic layers 26 (26a to 26e), the electrode layers 27 (27a to 27c) are tightly connected to and are not separated from the ceramic layers 26 (26a to 26e) which are in contact therewith so as to maintain laminate structures 29 (29a to 29c), and in addition, the other side surfaces of the ceramic layers 26b, 26c, 26d, and 26e which are in contact with the metal layers 28a and 28b are separated therefrom, so that ceramic plates having laminate structures 29a to 29c can be obtained.

According to the additional preferred embodiment, the ceramic plates each having a laminate structure can also be obtained and can be applied to laminate type electronic components having a laminate structure.

The present invention is not limited to the preferred embodiments described above, and without departing from the spirit and the scope of the present invention, various modifications may be made. For example, in the ceramic green sheet forming step 1, when various ceramic green sheets having different thicknesses are formed, various ceramic plates having different thicknesses can be easily obtained with high efficiency.

In addition, in the above-described preferred embodiments, although the Pb-based piezoelectric ceramic material is preferably used as a ceramic material, of course, another ceramic material, such as a non-lead piezoelectric ceramic material or a dielectric ceramic material, may also be used.

In addition, in the above-described preferred embodiments, although the ceramic green sheets provided with the electrode films and the ceramic green sheets provided with the metal films preferably are alternately laminated to each other, of course, the structure may be formed in which ceramic green sheets provided with the electrode films are laminated to each other, and on one surface in the above laminate at which the separation is desirably performed, a ceramic green sheet provided with the metal film may be provided.

Next, examples according to preferred embodiments of the present invention will be described in detail.

Example 1

After $Pb_3O_4$, $TiO_2$, $ZrO_2$, $MnO_2$, and $Nb_2O_5$ were prepared as ceramic raw materials, these ceramic raw materials in predetermined amounts were weighed and were then charged in a ball mill containing partially stabilized zirconia (pulverizing media) for mixing and wet pulverization, followed by drying, and subsequently, a calcination treatment was performed at a predetermined temperature, so that a $Pb\{(Mn,Nb)Ti,Zr\}O_3$-based piezoelectric ceramic powder was formed.

Next, after an organic binder and a dispersing agent were added to this piezoelectric ceramic powder together with purified water, mixing and wet pulverization were again performed in a ball mill to form a ceramic slurry. Subsequently, this ceramic slurry was processed by a doctor blade method to form a ceramic green sheet having a thickness of about 20 μm, and this ceramic green sheet was then cut into sheets having a length of about 20 mm and a width of about 30 mm.

Next, after a metal paste (hereinafter referred to as "Pd paste") containing Pd as a solid component was formed, this Pd paste was applied to the entire surfaces of the ceramic green sheets obtained by the above cutting step while the thickness thereof was being adjusted to about 3.0 μm, so that metal films were formed on the ceramic green sheets.

Subsequently, three ceramic green sheets provided with the metal films thus obtained were laminated to each other, and a ceramic green sheet provided with no metal film was laminated on the topmost layer, followed by pressure bonding in the lamination direction, so that a laminate was formed.

Then, a debinder treatment was performed for the laminate at about 400° C. in the air atmosphere, and the laminate was then processed by a firing treatment.

That is, the firing treatment was performed for approximately 2 hours at temperatures different by about 20° C. in the range of from about 1,060 to about 1,180, and as a result, seven types of samples processed at the different firing temperatures were obtained (Sample No. 1).

In addition, seven types of samples processed by different sintering temperatures were obtained by a method and a procedure similar to those described above except that instead of the above Pd paste, an electrode paste (hereinafter referred to as "first Ag—Pd paste") having a composition ratio of Ag to Pd of about 70 to about 30 on a weight percent basis and an electrode paste (hereinafter referred to as "second Ag—Pd paste") having a composition ratio of Ag to Pd of about 30 to about 70 on a weight percent basis were used (Sample Nos. 2 and 3).

In addition, when the cross-sections of the individual samples of Sample Nos. 1 to 3 were investigated by an electron microscope, it was confirmed that the ceramic layers were not connected to each other through the metal layers, and that the crosslinking was not formed.

In addition, seven types of samples processed by different sintering temperatures were obtained by a method and a procedure similar to those of Sample No. 1 except that the metal films were formed on the entire surfaces of the ceramic green sheets using the above Pd paste and the first and the second Ag—Pd pastes while the thickness was being adjusted to 1.5 μm.

Subsequently, when the cross-sections of the individual samples of Sample Nos. 4 to 6 were investigated by an electron microscope, it was confirmed that the ceramic layers were connected to each other in the lamination direction, and that the crosslinking was formed.

Next, after the samples of Sample Nos. 1 to 6 were immersed in a treatment bath filled with n-butyl alcohol for approximately 50 hours and were then recovered from the treatment bath, whether the metal layers and the ceramic layers were separated or not was investigated.

Table 1 shows the status of separation at the individual temperatures. In Table 1, ○ indicates the case in which the ceramic layer and the metal layer are completely separated from each other, and Δ indicates the case in which the metal layer is partly adhered to one surface of the ceramic layer and cannot be completely separated therefrom. In addition, X indicates the case in which the ceramic layer cannot be separated from the metal layer at all.

TABLE 1

| Sample | Metal Film | | | Firing Temperature (° C.) | | | | | | |
|---|---|---|---|---|---|---|---|---|---|---|
| No. | Component | Weight Ratio | Thickness | 1,060 | 1,080 | 1,100 | 1,120 | 1,140 | 1,160 | 1,180 |
| 1 | Pd | — | 3.0 | x | x | ○ | ○ | ○ | ○ | ○ |
| 2 | Ag/Pd | 70/30 | 3.0 | x | x | x | x | x | x | — |
| 3 | Ag/Pd | 30/70 | 3.0 | x | x | Δ | Δ | Δ | Δ | Δ |
| 4 | Pd | — | 1.5 | x | x | Δ | Δ | Δ | Δ | Δ |
| 5 | Ag/Pd | 70/30 | 1.5 | x | x | x | x | x | x | — |
| 6 | Ag/Pd | 30/70 | 1.5 | x | x | x | x | x | x | x |

As apparent from Table 1, it was confirmed that in Sample No. 1, when the firing temperature was about 1,100° C. or more, the ceramic layer could be completely separated from the metal layer. The reasons for this are believed to be that Pd does not diffuse into the ceramic during the firing; no glass component remains on the surface of the ceramic layer; the ceramic layers are not connected to each other due to the metal film having a large thickness of about 3.0 μm; and furthermore, since an oxidation-reduction reaction occurs at the interface by immersion of the sample in n-butyl alcohol, the oxygen present at the interface between the ceramic layer and the metal layer is removed.

When the firing was performed at about 1,060° C. and about 1,080° C. for the samples of Sample No. 1, the ceramic layer and the metal layer could not be separated from each other, and the reason for this is believed that the glass component remains on the surface of the ceramic layer at the above firing temperature and functions as an adhesive.

On the other hand, in Sample No. 2, even when the firing treatment was performed at a firing temperature of about 1,100° C. or more, the ceramic layer and the metal layer in the sintered body could not be separated from each other. The reason for this is believed that since the content of Ag in the metal film is about 70 percent by weight, Ag diffuses to the ceramic in the firing.

In addition, in Sample No. 3, even when the firing temperature was set to about 1,100° C. or more, the ceramic layer and the metal layer could not be completely separated from each other. The reason for this is believed that although the content of Ag in the metal film is decreased to about 30 percent by weight, there is still Ag diffusing to the ceramic in the firing.

In addition, in Sample No. 4, even when the firing temperature was set to about 1,100° C. or more, the ceramic layer and the metal layer could not be completely separated from each other. The reason for this is believed that although the metal film is formed only from Pd, since the thickness thereof is decreased to about 1.5 μm, the ceramic layers are connected to each other.

In addition, in Sample Nos. 5 and 6, the ceramic layer and the metal layer could not be completely separated from each other. The reason for this is believed that since Ag is contained in the metal film, and the thickness thereof is decreased to about 1.5 μm, Ag diffuses into the ceramic and the ceramic layers are connected to each other.

When ultrasonic waves were applied in n-butyl alcohol to the samples (marked with x) in Table 1 in which the ceramic layer and the metal layer could not be separated from each other at all, the ceramic layer and the metal layer could be separated from each other by increasing the intensity of the ultrasonic waves or by increasing the time for applying the ultrasonic waves; however, it was confirmed that cracks were generated in the separated ceramic layer, that is, in the ceramic plate.

Example 2

A Pb{(Ni,Nb)Zr,Ti}$O_3$-based piezoelectric ceramic powder was formed by a method and a procedure similar to those of Example 1 using $Pb_3O_4$, $TiO_2$, $ZrO_2$, NiO, and $Nb_2O_5$ as ceramic raw materials.

Subsequently, after samples of Sample Nos. 11 to 16 were formed in a manner similar to that in Example 1, were then immersed in a treatment bath filled with n-butyl alcohol for approximately 50 hours, and were then recovered from the treatment bath, whether the metal layer and the ceramic layer were separated or not was investigated. In this example, the firing temperature was set to approximately 1,050° C., 1,110° C., 1,150° C., and 1,180° C.

Table 2 shows the status of separation at the individual firing temperatures. In Table 2, ○ indicates the case in which the ceramic layer and the metal layer are completely separated from each other, and x indicates the case in which the ceramic layer cannot be separated from the metal layer at all.

TABLE 2

| Sample | Metal Film | | | Firing Temperature (° C.) | | | |
|---|---|---|---|---|---|---|---|
| No. | component | Weight Ratio | Thickness | 1,050 | 1,110 | 1,150 | 1,180 |
| 11 | Pd | — | 3.0 | x | ○ | ○ | ○ |
| 12 | Ag/Pd | 70/30 | 3.0 | x | x | — | — |
| 13 | Ag/Pd | 30/70 | 3.0 | x | — | — | — |
| 14 | Pd | — | 1.5 | x | x | x | x |
| 15 | Ag/Pd | 70/30 | 1.5 | x | — | — | — |
| 16 | Ag/Pd | 30/70 | 1.5 | x | — | — | — |

As apparent from Table 2, in Sample No. 11, for the reason similar to that of Sample No. 1 of Example 1, when the firing was performed at a low temperature of about 1,050° C., the ceramic layer and the metal layer could not be separated from each other; however, it was found that when the firing temperature was about 1,110° C. or more, the ceramic layer could be completely separated from the metal layer.

In addition, in Sample Nos. 12 to 16, by the reasons similar to those of Sample Nos. 2 to 6 of Example 1, the ceramic layer and the metal layer could not be separated from each other.

Example 3

A (Pb,La)$TiO_3$-based piezoelectric ceramic powder was formed by a method and a procedure similar to those of Example 1 using $Pb_3O_4$, $TiO_2$, and $La_2O_3$ as ceramic raw materials.

Subsequently, after metal films having a thickness of about 3.0 μm were formed on surfaces of ceramic green sheets using a Pd-based paste by a method and a procedure similar to those of Example 1 to form laminates, a firing treatment was performed at a firing temperature of about 1,110° C., so that sintered bodies were formed.

After the sintered bodies were immersed in a treatment bath filled with n-butyl alcohol for approximately 50 hours and were then recovered from the treatment bath, whether the metal layer and the ceramic layer were separated or not was investigated, and it was confirmed that the ceramic layer and the metal layer were separated from each other.

Example 4

Metal films were formed by applying a Pd paste on surfaces of the ceramic green sheets formed in Example 1 so as to have thicknesses as shown in Table 3. Subsequently, samples of Sample Nos. 21 to 24 were obtained by a method and a procedure similar to those of Example 1 except that the firing was performed at a constant firing temperature of about 1,110° C.

Next, the samples were immersed in n-butyl alcohol for approximately 50 hours, and the separation properties between the ceramic layer and the metal layer was investigated.

In addition, the cross-sections of the individual samples were observed by an electron microscope, and whether the ceramic layers were connected to each other through crosslinking was investigated.

Table 3 shows the results of the above investigation.

TABLE 3

| Sample No. | Thickness of Metal Film (μm) | Separation Status | Presence of Crosslinking |
| --- | --- | --- | --- |
| 21 | 1.3 | Δ | Yes |
| 22 | 1.9 | ◯ | No |
| 23 | 2.5 | ◯ | No |
| 24 | 3.7 | ◯ | No |

As apparent from Table 3, in Sample No. 21, since the metal film had a small thickness of about 1.3 μm, it was confirmed that the ceramic layers were connected to each other and that crosslinking was formed. Hence, the metal layer and the ceramic layer could not be successfully separated from each other.

On the other hand, in Sample Nos. 22 to 24, since the metal film had a large thickness of about 1.9 μm to about 3.7 μm, the ceramic layers did not form crosslinking therebetween, and hence the metal layer and the ceramic layer could be completely separated.

Accordingly, in the case of the Pb-based piezoelectric ceramic material, it was confirmed that when the thickness of the metal film was about 1.9 μm or more, good separation properties could be obtained between the metal layer and the ceramic layer.

Example 5

After the ceramic green sheets, the Pd paste, and the first Ag—Pd paste, which were formed in Example 1, were prepared, the Pd paste or the first Ag—Pd paste was applied on surfaces of the ceramic green sheets, so that the metal films or the electrode films were formed on the ceramic green sheets.

Next, after the ceramic green sheets provided with the electrode films and the ceramic green sheets provided with the metal films were alternately laminated to each other to form a laminate, a sintered body was obtained by a method and a procedure similar to those of Example 1 except that the firing was performed at a constant firing temperature of about 1,120° C.

Subsequently, after the sintered body was immersed in a treatment bath filled with n-butyl alcohol for approximately 50 hours, the separation properties between the ceramic layer and the metal layer were investigated, and as a result, it was found that separation occurred only between the metal film and the ceramic layer, and that ceramic plates having a laminate structure composed of the electrode layer and the ceramic layer tightly connected to each other were obtained.

Example 6

By applying a doctor blade method to a ceramic slurry composed of a piezoelectric ceramic material having a composition similar to that of Example 1, first ceramic green sheets having a thickness of about 10 μm and second ceramic green sheets having a thickness of about 100 μm were formed, and metal films having a thickness of about 3 μm were then formed on surfaces of the first and the second ceramic green sheets.

Next, as shown in FIG. 10, first ceramic green sheets 30a to 30c provided with metal films 31a to 31c, respectively, were sequentially laminated to each other, and on the topmost layer thereof, a first ceramic green sheet 30d was laminated, followed by pressure bonding, so that a first laminate was formed. Subsequently, a first sintered body was obtained by a method and a procedure similar to those of Example 1 except that the firing was performed at a constant firing temperature of about 1,120° C.

Figure 11:
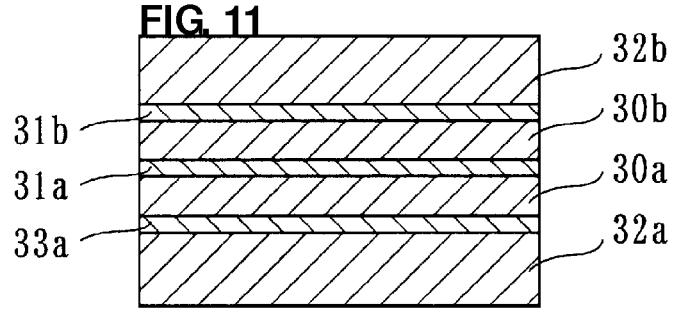
FIG. 11 is a cross-sectional view of a second laminate formed in Example 6.

In addition, as shown in FIG. 11, a second laminate was formed in which the first ceramic green sheets 30a and 30b provided with the metal films 31a and 31b, respectively, were sandwiched by a second ceramic green sheet 32a provided with a metal film 33a and a second ceramic green sheet 32b provided with no metal film, those having a thickness larger than that of the first ceramic green sheets 30a and 30b, and a firing treatment similar to that described above was performed, thereby forming a second sintered body.

Figure 12:
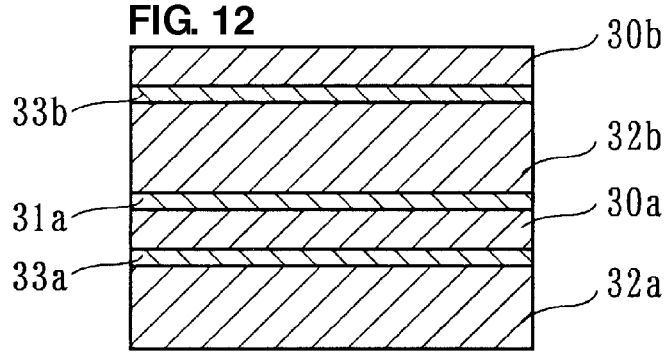
FIG. 12 is a cross-sectional view of a third laminate formed in Example 6.
Figure 13:
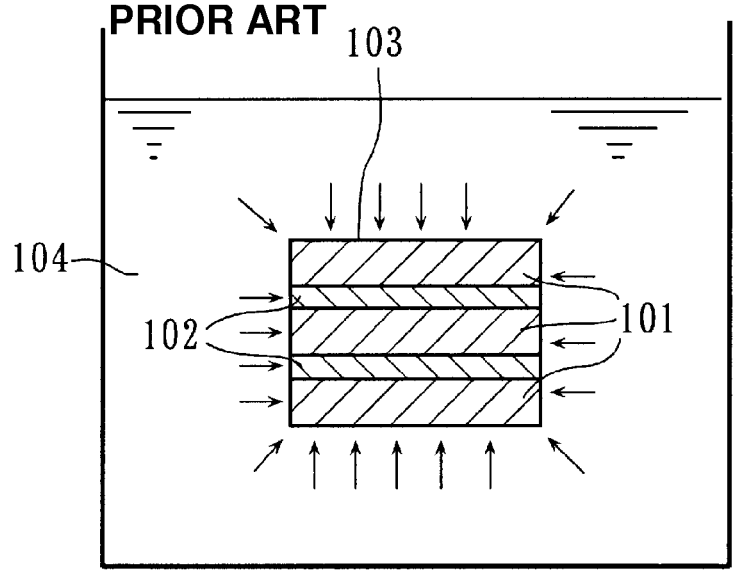
FIG. 13 is a view showing a conventional method for manufacturing ceramic plates.

Furthermore, as shown in FIG. 12, the first ceramic green sheet 30a provided with the metal film 31a was sandwiched by the second ceramic green sheets 32a and 32b provided with the metal film 33a and a metal film 33b, respectively, and having a thickness larger than that of the first ceramic green sheet 30a, and on the topmost surface, the first ceramic green sheet 30b was laminated to form a third laminate, followed by a firing treatment similar to that described above, so that a third sintered body was obtained.

Subsequently, the first to the third sintered bodies were immersed in n-butyl alcohol for approximately 50 hours, and it was confirmed that the ceramic layers and the metal layers were completely separated from each other.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing ceramic plates in which the ceramic plates are obtained by separating ceramic layers from a sintered body composed of the ceramic layers and metal layers alternately laminated to each other, the method comprising:

a ceramic green-sheet forming step of forming ceramic green sheets from ceramic raw materials;

a metal paste forming step of forming a metal paste using a metal component as a solid component which does not diffuse into ceramic during firing;

a metal film forming step of applying the metal paste on surfaces of the ceramic green sheets to form metal films each having a thickness such that ceramic layers to be formed after firing are not connected to each other in the lamination direction;

a laminate forming step of laminating the ceramic green sheets provided with the metal films to form a laminate;

a firing step of performing a firing treatment for the laminate at a firing temperature which is set to a high temperature at which no glass component remains on surfaces of the ceramic layers after the firing and to a temperature equal to or lower than a decomposition temperature of a ceramic material forming the ceramic layers so as to form the sintered body composed of the ceramic layers and the metal layers alternately laminated to each other; and a separation step of immersing the sintered body in an oxygen removal processing liquid which removes oxygen present between the ceramic layers and the metal layers to separate the ceramic layers and the metal layers from one another without applying any external forces thereto.

2. The method for manufacturing ceramic plates, according to claim 1, the method further comprising an electrode paste forming step of forming an electrode paste containing a conductive component which diffuses into the ceramic during the firing, and an electrode film forming step of applying the electrode paste on surfaces of the ceramic green sheets to form electrode films, wherein the laminate formed in the laminate forming step includes the ceramic green sheets provided with the electrode films.

3. The method for manufacturing ceramic plates, according to claim 1, wherein the metal component comprises palladium.

4. The method for manufacturing ceramic plates, according to claim 1, wherein the oxygen removal processing liquid is a reducing solution comprising an organic compound which includes at least one of a hydroxyl group, an aldehyde group, and a carboxyl group.

5. The method for manufacturing ceramic plates, according to claim 4, wherein the oxygen removal processing liquid comprises a liquid alcohol.

6. The method for manufacturing ceramic plates, according to claim 5, wherein the liquid alcohol is one of an aliphatic alcohol, a cycloaliphatic alcohol, an aromatic alcohol, a heterocyclic alcohol, and a mixture thereof.

7. The method for manufacturing ceramic plates, according to claim 6, wherein the aliphatic alcohol is n-butyl alcohol.

8. The method for manufacturing ceramic plates, according to claim 1, wherein the ceramic material forming the ceramic green sheets is a lead-based piezoelectric ceramic material containing a lead component.

9. The method for manufacturing ceramic plates, according to claim 1, wherein the metal films have a thickness of about 1.9 μm to about 10 μm.

10. The method for manufacturing ceramic plates, according to claim 1, wherein the ceramic green sheet forming step forms a plurality types of ceramic green sheets which have different thicknesses.

\* \* \* \* \*